United States Patent [19]
Takayama

[11] Patent Number: 4,671,853
[45] Date of Patent: Jun. 9, 1987

[54] IMAGE SENSOR MANUFACTURING METHOD

[75] Inventor: Satoshi Takayama, Kawasaki, Japan

[73] Assignee: Kabushiki Kaisha Toshiba, Kawasaki, Japan

[21] Appl. No.: 828,648

[22] Filed: Feb. 12, 1986

[30] Foreign Application Priority Data

Feb. 27, 1985 [JP] Japan .................................. 60-38055

[51] Int. Cl.⁴ ........................... C23F 1/02; B44C 1/22; H01L 31/00
[52] U.S. Cl. .................... 156/659.1; 29/572; 136/258; 156/648; 156/656; 427/86
[58] Field of Search ................ 29/572, 591; 156/648, 156/656, 659.1, 662, 667; 427/86; 430/5, 313, 318; 357/17, 19, 30, 71; 136/243, 258

[56] References Cited

U.S. PATENT DOCUMENTS 4,528,065  7/1985  Yamazaki ............................ 156/643
4,568,409  2/1986  Caplan ................................ 156/643

FOREIGN PATENT DOCUMENTS 58-130563   8/1983  Japan .
58-195356  11/1983  Japan .

OTHER PUBLICATIONS

D. L. Staebler et al., "Reversible Conductivity Changes in Discharge-Produced Amorphous Si$^a$", *Applied Physics Letters*, vol. 31, No. 4, Aug. 15, 1977, pp. 292–294.

Primary Examiner—William A. Powell
Attorney, Agent, or Firm—Oblon, Fisher, Spivak, McClelland & Maier

[57] ABSTRACT

In a method of manufacturing image sensors, an electrode layer of an opaque metal material is formed on a transparent ceramic substrate and is patterned into individual electrodes in photoengraving process. An amorphous semiconductor layer is deposed over the electrodes formed on the substrate and a common electrode is formed on the amorphous semiconductor layer. The amorphous semiconductor layer is exposed with light rays through the substrate so that each portions of the layer which is located above surface regions of the substrate between the electrodes have high electric resistance.

10 Claims, 17 Drawing Figures

IMAGE SENSOR MANUFACTURING METHOD

BACKGROUND OF THE INVENTION

This invention relates to a method of manufacturing an image sensor by arranging a large number of photoelectric converting elements on a substrate, and, more particularly, to an image sensor manufacturing method which effectively reduces a leak current generated between the adjacent photoelectric converting elements.

To date, various types of image sensors have been accepted tor use in facsimile units, optical character readers, electronic image pickup tubes, etc. Attention has been drawn particularly to a long, one-dimensional image sensor having the same pickup length as the width of an original impression. Energetic headway is being made in the research and development of image sensors. In recent years, great demand has arisen, in the interest of ensuring high resolution reading, for a high density arrangement of photoelectric converting elements.

Among the desirable properties of a photoelectric converting element involved in an image sensor, the degree of resolution constitutes one of particular importance. The conventional image sensor is accompanied with the drawbacks that, as the photoelectric converting elements are more closely arranged, a larger leak current is generated between the electrodes of the adjacent photoelectric converting elements. Consequently, sufficient improvement in resolution is not ensured, even if the photoelectric converting elements are densely arranged.

Detailed description may now be made of the above-mentioned problems. With a long image sensor, a plurality of photoelectric converting elements are generally arranged on a substrate. The photoelectric converting element is constructed by arranging separate electrodes prepared from, for example, chromium, on a substrate; depositing an amorphous semiconductor layer 4 such as that prepared from amorphous hydrogenated silicon (a-Si:H) on said separate electrodes and substrate; forming a common electrode prepared from a transparent conductive layer prepared from, for example, indium tin oxide (ITO); and interposing said amorphous semiconductor layer between the separate electrodes and common electrode (a sandwich arrangement). In the above-mentioned sandwiched arrangement, photoelectric current $I_P$, conducted through the respective photoelectric converting elements by incoming light rays, involves not only signal current $I_C$ which has a directional flow due to the presence of a potential barrier produced in an interface between the amorphous semiconductor layer and common electrode, but also leak current $I_L$ which has no directional flow due to the presence of a potential difference between respective individual electrodes 3-1, 3-2 and 3-3. Said leak current $I_L$ reduces the resolution degree of an image sensor.

Figure 1:
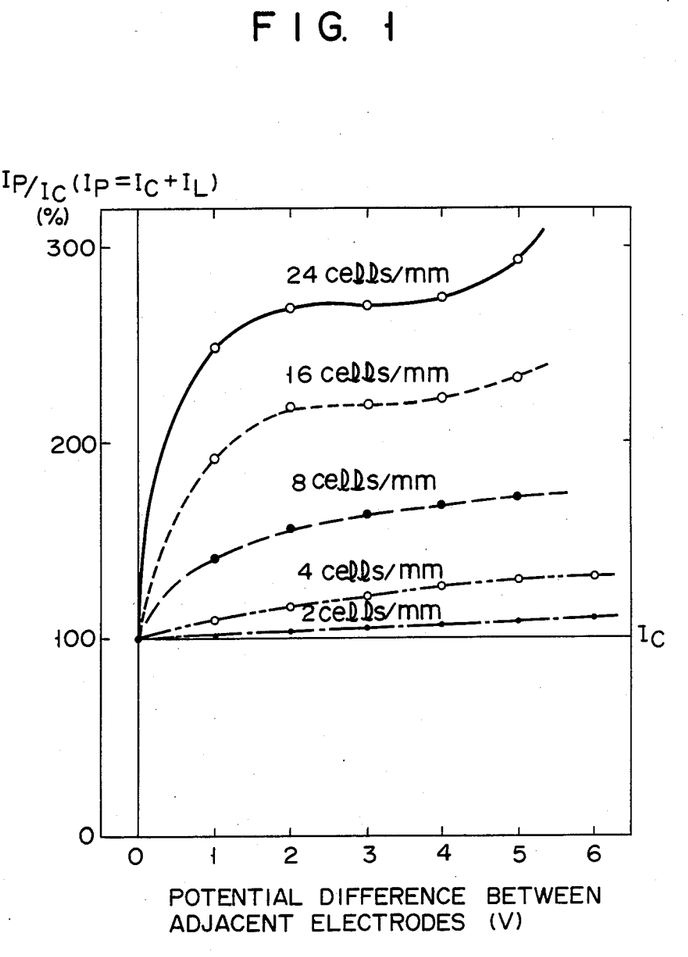
FIG. 1 graphically illustrates the results of determining the relationship between the ratio of the photocurrent and a signal current, observable in the conventional image sensor, and the potential difference between the adjacent electrodes, with the image sensors assembled in various densities.

With respect to image sensors comprising photoelectric converting elements each being composed of ITO/a-Si:H/Cr, and arranged with densities of 2/mm to 24/mm, determination was made of the relationship between the ratio ($I_P/I_C$) of photoelectric current $I_P$ and signal current $I_C$, and the potential difference between the adjacent individual electrodes, the results being set forth in FIG. 1. The above-mentioned data were obtained under conditions in which the temperature was set at 20° C. and the luminosity of the light beams illuminated on the image sensors was 100 luxes. The data of FIG. 1 shows that when a potential difference between individual adjacent electrodes stands at 0.5 volts, the ratio of the leak current to the signal current estimated at 30% when the image sensors are arranged at a density of 8/mm, 60% when the image sensors are arranged at a density of 16/mm, and 120% when the image sensors are arranged at a density of 24/mm, indicating that the upper limit of high density arrangement of image sensors is 8/mm. When image sensors are arranged at a higher density than 8/mm, it is necessary to suppress the occurrence of a leak current by some means or other.

To date, the undermentioned processes have been adopted to suppress the occurrence of a leak current: (1) A highly resistive layer has been applied as a photoelectric converting layer. (2) A light shield has been provided to shut out unnecessary light beams brought into the regions defined between the adjacent photoelectric converting elements. (3) The respective photoelectric converting elements have been electrically isolated from each other. Process (1) however, has the drawbacks that the properties of the image sensor are harmfully affected by the nature of the photoelectric converting membrane, with $\mu\tau$ (a factor representing carrier mobility $\times$ carrier life) in particular dropping, resulting in a decline in photo-responsivity and band characteristics. Similarly, processes (2) and (3) are accompanied by the difficulties and high cost that, during the manufacture of an image sensor, it is necessary to make the photo etching process

SUMMARY OF THE INVENTION

It is, accordingly, the object of this invention to provide a low cost method of manufacturing an image sensor so constructed as to effectively minimize the occurrence of a leak current between the adjacent photo-electric converting elements.

To attain the above-mentioned object, this invention provides a method of manufacturing an image sensor by arranging, on a ceramic substrate, a plurality of individual electrodes, made of opaque metal materials, and a common electrode made of a transparent conductive layer, and interposing an amorphous semiconductor layers between said individual electrodes and common electrode, wherein regions defined between the respective photoelectric converting elements arranged on the amorphous semiconductor layers are enabled to have a high electric resistance when exposed to light.

When a larger quantity of light than a predetermined quantity is illuminated on an amorphous semiconductor layer prepared from, for example, a-Si:H, for a longer length of time than a predetermned length of time, that portion of said semiconductor layer exposed to the light increases in resistance. This phenomenon is known as the "Staebler-Wronski" effect. This event is generally regarded as an undesirable phenomenon. However, the present invention utilizes this phenomenon to advantage in selectively imparting high resistance to those regions of the amorphous semiconductor layer which make no contribution to the generation of a signal current, namely, the regions defined between the adjacent photoelectric converting elements, thereby effectively reducing the amount of current leakage.

DETAILED DESCRIPTION OF THE PREFERRED EMBODIMENTS

Figure 2A:
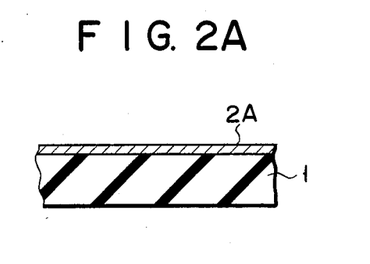
FIGS. 2A to 2F indicate the sequential steps of manufacturing an image sensor according to a first embodiment of this invention.
Figure 2B:
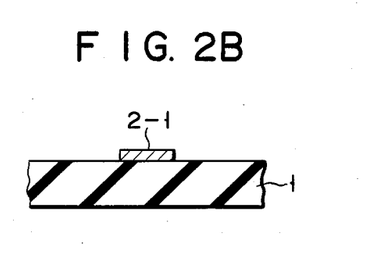
Figure 2C:
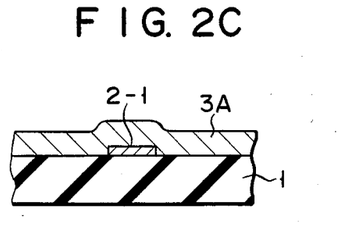
Figure 2D:
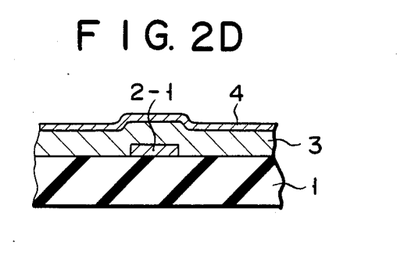
Figure 2E:
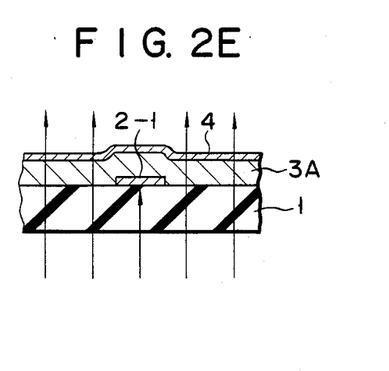
Figure 2F:
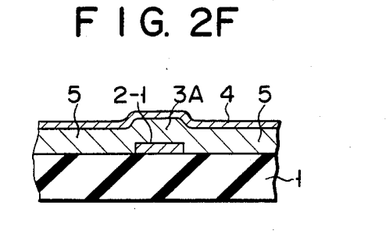
Figure 3A:
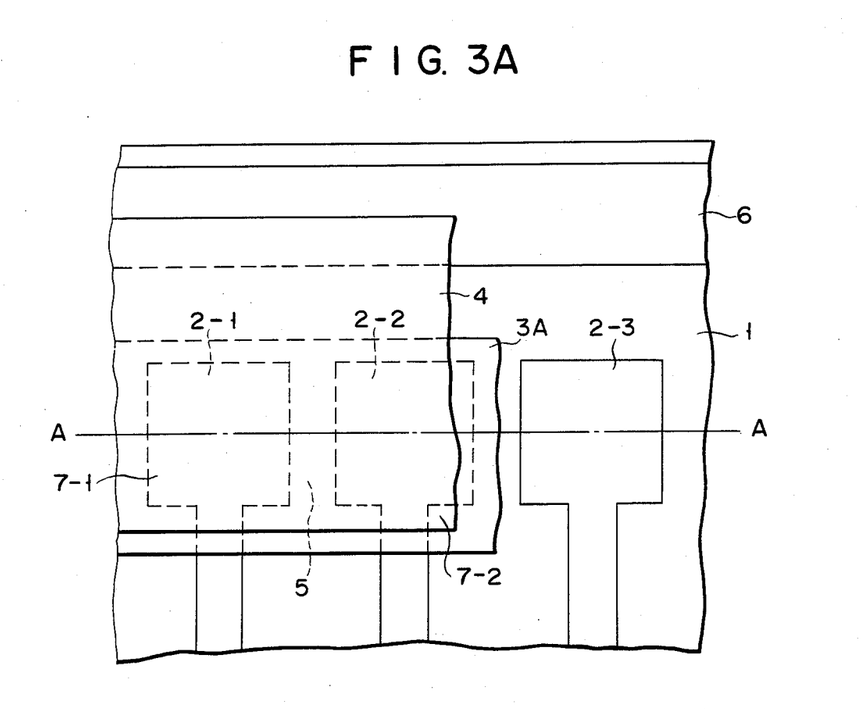
FIG. 3A is a plane view of an image sensor manufactured through the steps indicated in FIGS. 2A to 2F.
Figure 3B:
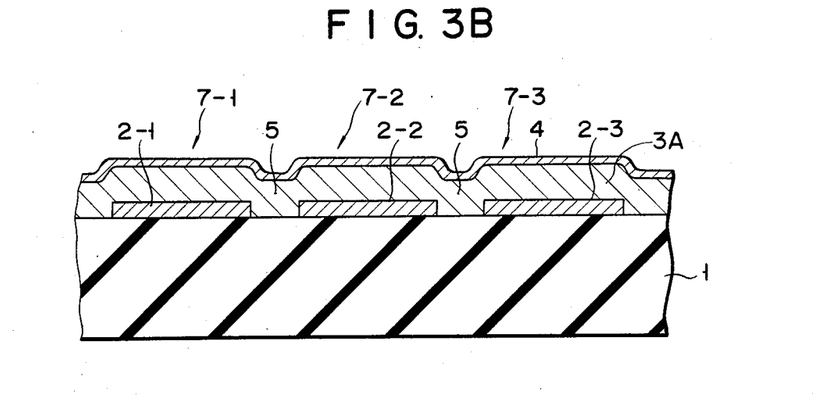
FIG. 3B is a sectional view on line A—A of FIG. 3A.

FIGS. 2A to 2F are sectional views showing the sequential steps of manufacturing an image sensor according to a first embodiment of this invention. First, formed on one side of transparent substrate 1, prepared from, for example, glass, are individual electrodes 2-1, 2-2 and 2-3, composed of an opaque metal material such as chromium, as illustrated in FIGS. 3A and 3B. After the surface of substrate 1 is cleaned, individual electrodes 2-1, 2-2 and 2-3, composed of Cr, are formed on said surface by thermal deposition or sputtering. First, Cr layer 2A shown in FIG. 2A is deposited to a thickness of about 3,000 Å. Then, as shown in FIG. 2B, Cr layer 2A is patterned into individual electrode 2-1 by the photoengraving process. Thereafter, as seen from FIG. 2C, band-shaped, amorphous semiconductor layer 3A, prepared from, for example, hydrogenized amorphous silicon (a-Si:H), is mounted on substrate 1 and said individual electrode 2-1 by, for example, the plasma CVD process. Thereafter, as illustrated in FIG. 2D, transparent, conductive, common electrode 4, prepared from indium tin oxide (ITO), is, for example, sputtered on at least amorphous semiconductor layer 3. The image sensor fabricated by the steps shown up to FIG. 2D undergoes heating at a temperature higher than 100° C. When heating is brought to an end, the other side of the substrate is uniformly illuminated with about 200,000 luxes for about an hour, as shown in FIG. 2E. Since substrate 1 is transparent, light rays illuminated on said other side of substrate 1 permeate through it to the opposite side. In this case, light is not illuminated on that portion of amorphous semiconductor layer 3A which overlies said individual electrode 2-1. Those regions of amorphous semiconductor layer 3A which face the interstices between individual electrodes 2-1, 2-2 and 2-3, namely, the regions defined between respective photoelectric converting elements 7-1, 7-2 and 7-3 are exposed to light rays. As a result, those portions of amorphous semiconductor layer 3 which are illuminated by light rays are selectively formed into highly resistive regions 5 as shown in FIG. 2F.

FIGS. 3A and 3B indicate the structure of an image sensor manufactured through above-mentioned steps 2A to 2F. The portions of FIGS. 3A and 3B the same as those of FIG. 2 are denoted by the same numerals. Reference numeral 6 denotes an auxiliary common electrode prepared from, for example, Cr. Though this auxiliary common electrode 6 is not always required, it is ordinarily formed on substrate 1 at the same time as individual electrodes 2-1, 2-2 and 2-3 in order to drop the electric resistance of common electrode 4, formed of a transparent conductive layer, thereby to minimize a voltage drop at this point.

Figure 4:
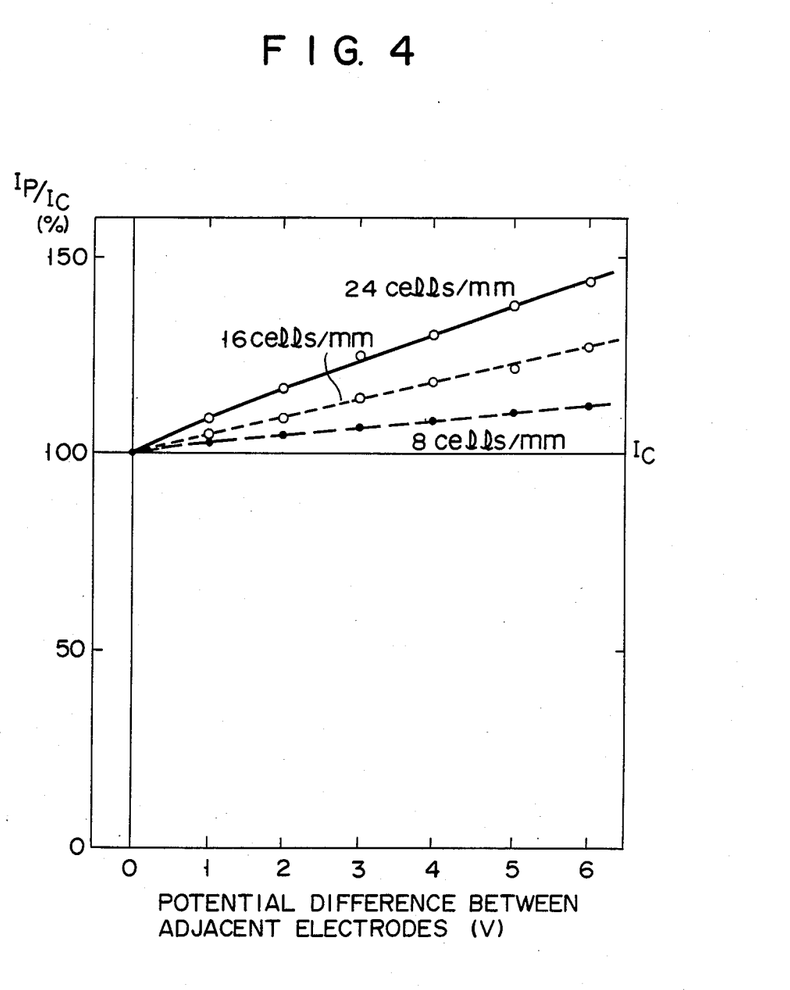
FIG. 4 indicates the relationship between the exposure period and the ratio of leak current $I_L$, occurring in an image sensor manufactured by the steps of FIGS. 2A to 2F, to signal current $I_C$ obtained in said image sensor.

Measurement was made of the relationship between the ratio ($I_P/I_C$) of photocurrent $I_P(=I_L+I_C)$ of the image sensors manufactured by the method of this invention and signal current $I_C$ running through said image sensors, and the potential differences between the adjacent electrodes assembled to various densities ranging from 2/mm to 24/mm, the result being set forth in FIG. 4. The data of this measurement was obtained under conditions in which the temperature was set at 20° C. and the luminosity of the light beams illuminated on the image sensors was 100 luxes. The data of FIG. 4 shows that when the potential difference between the adjacent electrodes stands at 0.5 V, the ratio of the leak current to the signal current indicates 2% when the image sensors are assembled with a density of 8/mm, 5% when the image sensor density shows 16/mm, and 5% when the image sensor density represents 24/mm, namely, the ratio of the leak current to the signal current is lower from what was observed in the conventional image sensor, to such extent that when adjacent electrodes are assembled to a density of 24/mm, the ratio does not exceed the practically applicable extent of 30%.

Figure 5:
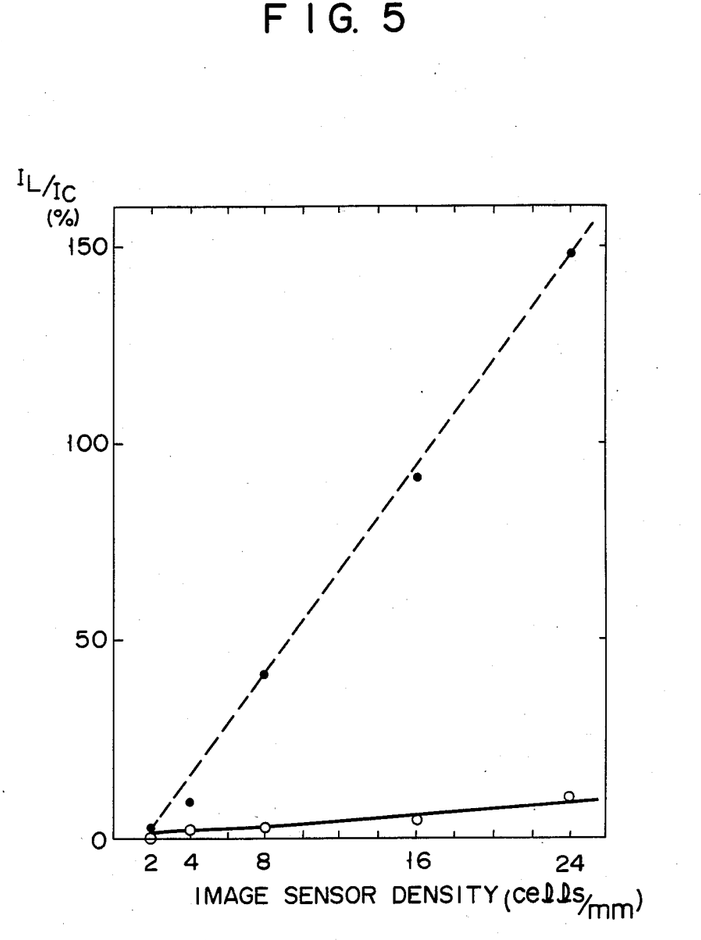
FIG. 5 graphically sets forth the relationship between the ratio ($I_P/I_C$) of photocurrent $I_P$ of the image sensor manufactured by the method of this invention and signal current $I_C$, occurring in said image sensor, and the various densities with which the image sensors of the invention are assembled, and also between a similar relationship observed in the conventional image sensor manufactured by steps not including the light-exposure illustrated in FIG. 2F.

The solid line of FIG. 5 represents the relationship between the ratio ($I_P/I_C$) of photocurrent $I_P$ of the image sensors manufactured by the method of this invention and signal current $I_C$ running through said sensors, and the densities to which said image sensors are assembled. The broken line of FIG. 5 indicates a similar relationship observed in conventional image sensors which were manufactured without employing the light-exposure step shown in FIG. 2F. The data shown in FIG. 5 were obtained under the condition in which the potential difference between the adjacent electrodes was set at 1 V, and the other factors were made to have the same values as those shown in FIG. 4. FIG. 5 indicates that the present invention noticeably reduces the ratio ($I_P/I_C$) of leak current to signal current running through the adjacent image sensors to 1/15 of what is observed in the conventional image sensors.

As mentioned above, the present invention offers the advantages that the ratio between the leak current and signal current can be reduced to a one-digit value, and it is possible to easily manufacture image sensors at a higher density than 8/mm without fear that the properties of the image sensors will deteriorate and without need of the complicated step of precisely locating a mask between the light source and the image sensors.

Figure 6A:
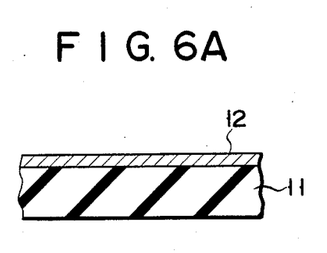
FIGS. 6A to 6F indicate the sequential steps of manufacturing an image sensor according to a second embodiment of the invention.
Figure 6B:
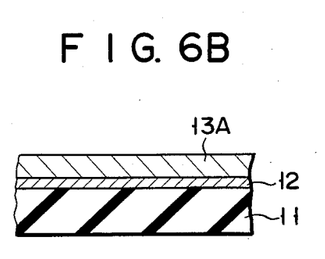
Figure 6C:
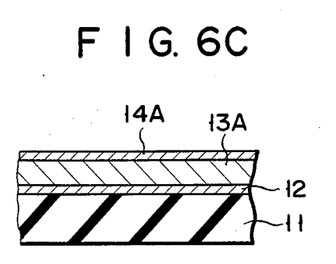
Figure 6D:
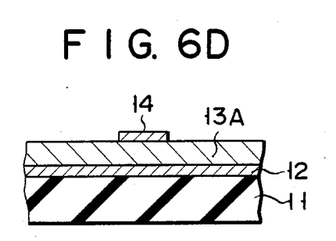
Figure 6E:
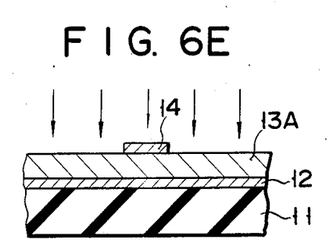
Figure 6F:
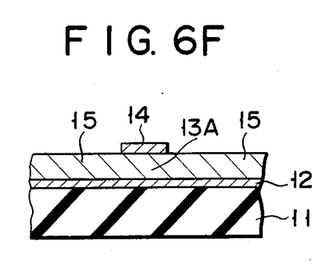

The foregoing embodiment refers to the case of manufacturing image sensors by depositing individual electrodes prepared from an opaque metal material on the substrate. However, this invention is also applicable to image sensors constructed by arranging individual electrodes prepared from a transparent conductive layer on the substrate. Description may now be made with reference to FIGS. 6A to 6F of image sensors manufactured according to the above-mentioned second embodiment. According to the second embodiment, transparent, common electrode membrane 12 is prepared-from, for example, indium tin oxide (ITO). Thereafter, as shown in FIG. 6B, amorphous semiconductor layer 13A is deposited on said common electrode layer 12. Later, as indicated in FIG. 6C, opaque metal layer 14A, prepared from, for example, chromium, is mounted on amorphous semiconductor layer 13A. Said opaque metal layer 14A is patterned into individual electrode 14 by the photo etching process, as illustrated in FIG. 6D. Then as shown in FIG. 6E, amorphous semiconductor layer 13A is exposed with light beams from the side of said individual electrode 14, thereby changing the regions interposed between the photoelectric converting elements mounted on amorphous semiconductor layer 13A into high electric resistive layers 15.

Image sensors manufactured as in the above-mentioned second embodiment offer the same effect as those of the first embodiment. Since, in the second embodiment, an image is impressed on the photoelectric converting element through substrate 11, the substrate of the image sensors should also be prepared from transparent material.

It should be noted that the present invention can be modified variously without departing from the scope and object of the invention. Throughout the foregoing embodiment, for example, the amorphous semiconductor layer was prepared from hydrogenated amorphous silicon (a-Si:H). However, any substance will of course attain the object, provided it gives the above-mentioned Staebler-Wronski effect. It is also possible to replace a-Si:H by a-SiC:H, a-Si:F or F or a-Ge:H. In short, the amorphous semiconductor layer admits of application to the present invention provided it contains at least one, for example, Ge selected from the elements belonging to Group IV of the periodic table and further at least one selected from the group consisting of H and F to act as a dangling bond. The proportions of the components such as H or F involved in the amorphous semiconductor membrane are preferred to range from 10 to 40 at. %.

As previously mentioned, the present invention effectively reduces a leak current generated between the adjacent photoelectric converting elements. The image sensor embodying the present invention enables a leak current to be reduced to less than one-tenth of what is observed in the conventional image sensor manufactured without employing a step of restricting the leak current; namely, can manufacture high performances image sensors which enable a leak current to be noticeably minimized though they are assembled with great density.

Further advantages offered by the present invention include those whereby a leak current can be restricted simply by light illumination, it is possible to dispense with either the complicated step of photo etching process and vacuum process, unlike in the conventional process which restricts the generation of a leak current by means of a shadow mask or isolation of image sensors, and thus image sensors can be manufactured at low cost.

What is claimed is:

1. A method of manufacturing image sensors which comprises the steps of:

forming a plurality of isolated electrodes, prepared from an opaque metal material, on one side of a transparent ceramic substrate;

depositing an amorphous semiconductor layer over the plural isolated electrodes mounted on said one side of the transparent ceramic substrate; and mounting a common electrode on said amorphous semiconductor layer, wherein a plurality of photoelectric converting elements are defined by said common electrode, individual electrodes and the intervening amorphous semiconductor layer, after whose formation light beams are illuminated from the opposite side of said ceramic substrate, causing those portions of said amorphous semiconductor layer which are defined between said photoelectric converting elements to have high electric resistance.

2. The method according to claim 1, wherein the formation of said individual electrodes is carried out by the steps of:

coating said one side of the substrate with a layer prepared from an opaque metal material to provide an electrode layer; and patterning the electrode layer into individual electrodes by photoengraving.

3. The method according in claim 1, wherein said amorphous silicon layer is deposited by the plasma CVD process or photo CVD process.

4. The method according to claim 1, wherein said amorphous silicon layer is prepared from an amorphous semiconductor material containing at least one semiconductor element selected from Group IV of the periodic table such as Si or Ge, and further at least one amorphous semiconductor element selected from the group consisting of H and F as a dangling bond.

5. The method according to claim 3, wherein said amorphous silicon layer is prepared from amorphous semiconductor material containing at least one selected from the group consisting of a-Si:H, a-SiC:H, a-Si:F and a-Ge:H.

6. A method of manufacturing image sensors which comprises the steps of:

forming a common electrode on one side of a transparent ceramic substrate;

depositing an amorphous semiconductor layer on the common electrode mounted on said one side of the transparent ceramic substrate; and mounting a plurality of isolated electrodes, prepared from an opaque metal material, on said amorphous semiconductor layer, wherein a plurality of photoelectric converting elements are defined by said common electrode, individual electrodes and amorphous semiconductor region interposed between said common electrode and individual electrodes, and the previously formed amorphous semiconductor layer is exposed with light beams through the ceramic substrate, thereby causing those portions of said amorphous semiconductor layer which are interposed between the adjacent photoelectric converting elements to have a high electric resistance.

7. The method according to claim 6, wherein said individual electrodes are formed by the steps of covering the amorphous semiconductor layer with an electrode layer prepared from an opaque metal material, and patterning said electrode layer into individual electrodes by the photoengraving process.

8. The method according to claim 1, wherein said amorphous silicon layer is deposited by the plasma CVD process or photo CVD process.

9. The method according to claim 1, wherein said amorphous silicon layer is prepared from amorphous semiconductor material which contains at least on semiconductor element such as Si and Ge of Group IV of the periodic table, and, further, at least one element selected from the group consisting of H and F as a dangling bond.

10. The method according to claim 3, wherein said amorphous silicon layer is prepared from an amorphous semiconductor material containing at least one selected from the group consisting of a-Si:H, a-SiC:H, a-Si:F and a-Ge:H.

* * * * *